United States Patent [19]

Robertson

[11] 4,140,896
[45] Feb. 20, 1979

[54] ELECTRONIC DIGITAL TAPE TIMER

[75] Inventor: David J. Robertson, Sunnyvale, Calif.

[73] Assignee: Ampex Corporation, Redwood City, Calif.

[21] Appl. No.: 792,220

[22] Filed: Apr. 29, 1977

[51] Int. Cl.² .................. G06M 3/14; H03K 27/00
[52] U.S. Cl. .......................... 235/92 SH; 235/92 T; 235/92 MP; 235/92 EV; 235/92 R; 360/137
[58] Field of Search ........... 235/92 T, 92 EV, 92 SH, 235/92 MP, 92 DN, 92 FQ, 92 EA, 92 PE, 92 DM, 103; 360/72, 137; 353/25, 26 R, 26 A; 58/145 R, 147, 152 R, 152 E

[56] References Cited

U.S. PATENT DOCUMENTS

| | | | |
|---|---|---|---|
| 3,602,698 | 8/1971 | Vigour | 235/92 EV |
| 3,604,624 | 9/1971 | Miura et al. | 360/137 |
| 3,764,781 | 10/1973 | Kreithen et al. | 235/92 MP |
| 3,803,587 | 4/1974 | Mead | 235/92 SH |
| 3,930,142 | 12/1975 | Meier | 235/92 T |
| 3,943,338 | 3/1976 | Gagniere | 235/92 EV |
| 3,986,333 | 10/1976 | Kimura et al. | 235/92 T |

Primary Examiner—Joseph M. Thesz
Attorney, Agent, or Firm—Robert G. Clay; George B. Almeida

[57] ABSTRACT

A digital tape timer containing a counter and associated arithmetic control and timing logic to detect the relative tape position and provide a time-multiplexed, binary coded decimal (BCD) output for the display of the tape position in hours, minutes, seconds and/or tenths of seconds of play/record time at any of the selected tape speeds. The timer employs an eight digit format; five digits are displayed and one of the three remaining digits becomes the least significant digit whose modulus is altered to present the correct division rate to the incoming tach pulses. The counter generates serial digits with one digit appearing on a selected line, whereby all eight digits are transmitted using four wires for the binary code plus one wire for selection of each digit to be displayed. Thus, the system inherently provides the added advantage of time-multiplexing of the timer system output. The pre-division of the tach pulses using the LSD provides division which instantly and accurately follows the counting direction.

23 Claims, 5 Drawing Figures

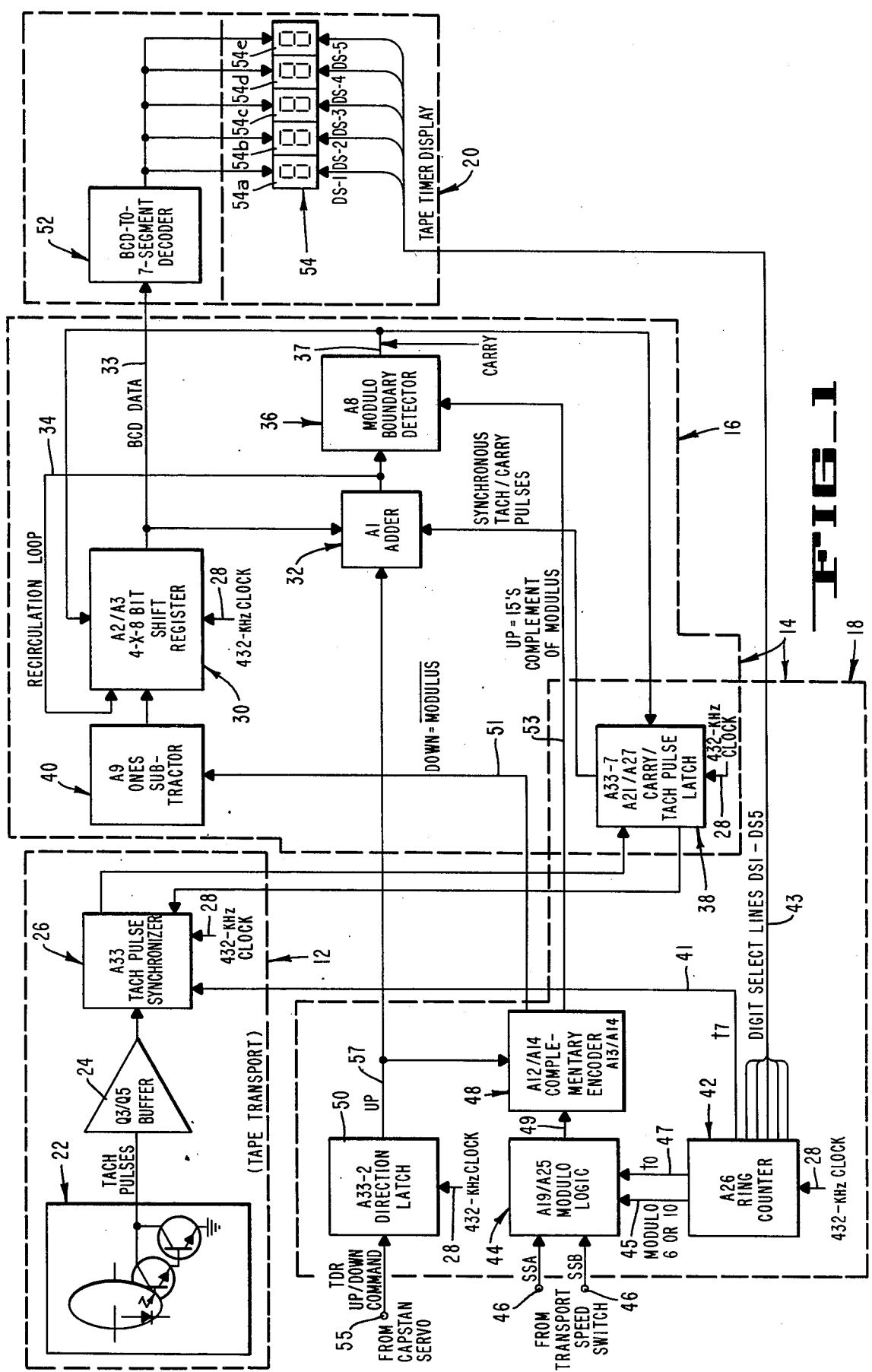

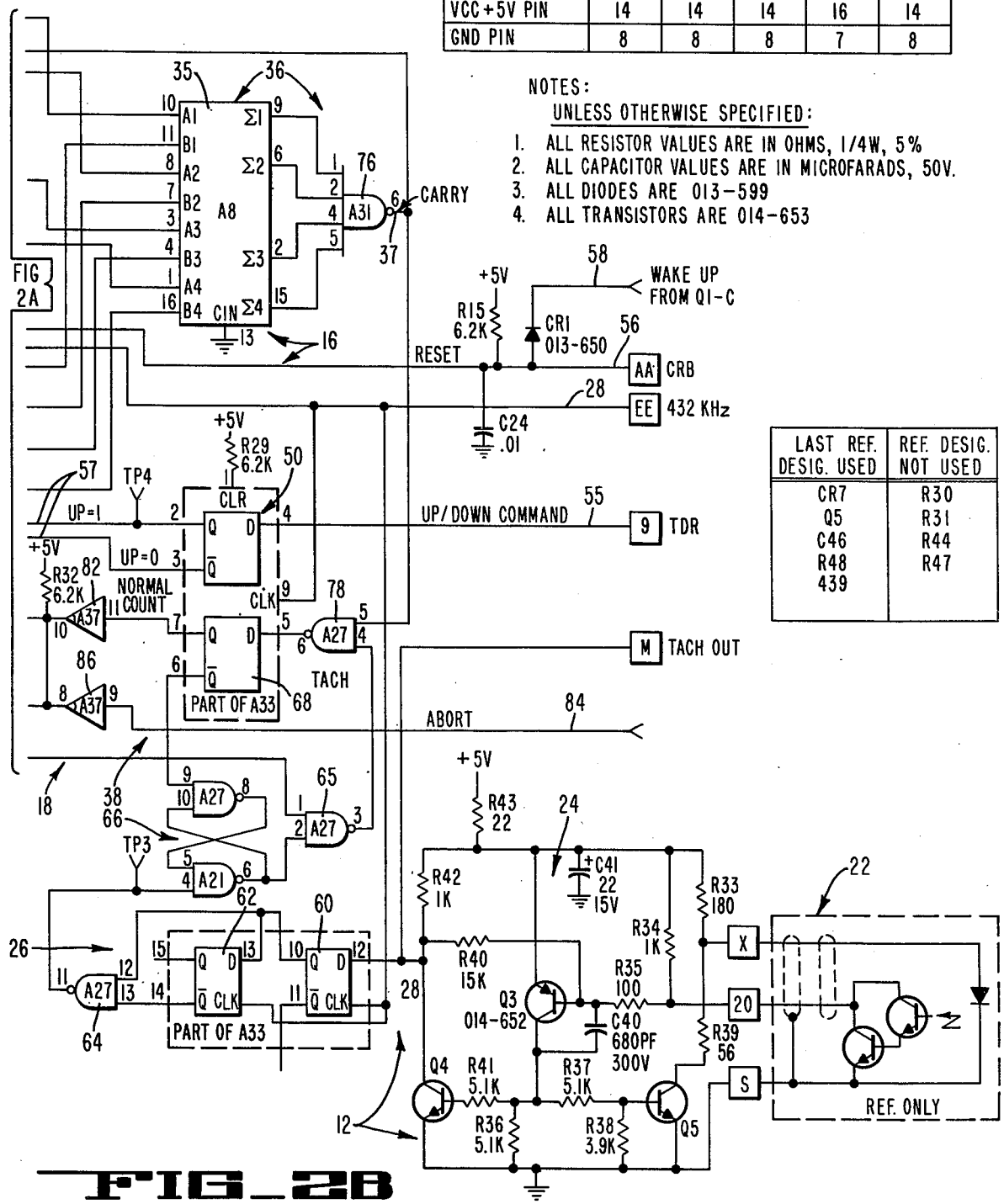
FIG_2B

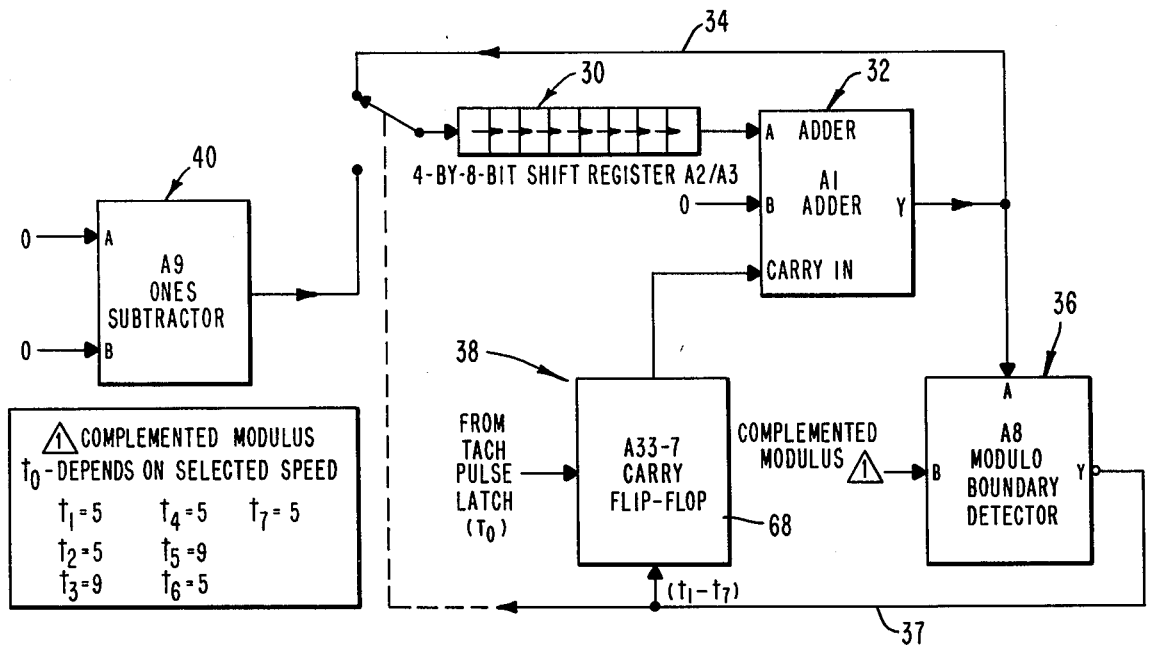
FIG_3
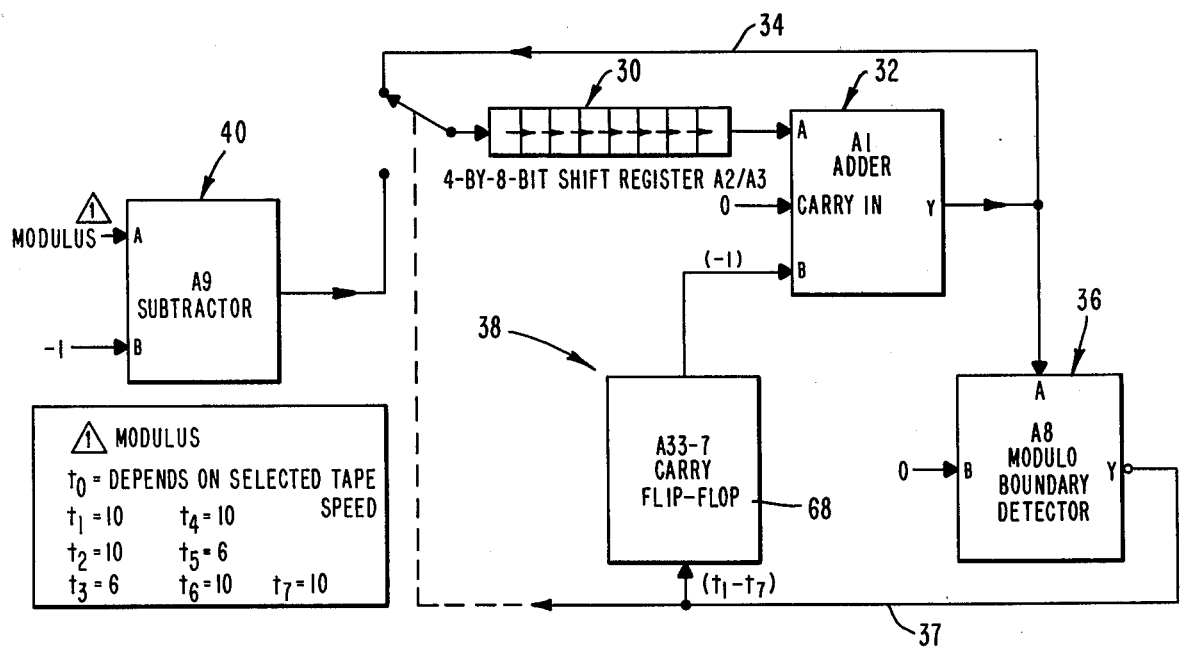
FIG_4

ELECTRONIC DIGITAL TAPE TIMER

BACKGROUND OF THE INVENTION

1. Field

The invention relates to electronic digital tape timers and particularly to a simplified video tape timer employing a serial binary adder as a bi-directional counter, with associated timing and control arithmetic logic.

2. Prior Art

Electronic tape timers are employed to accurately locate a desired point along a tape during transport thereof by a suitable tape transport apparatus, while continuously indicating the amount of relative elapsed time that the tape has been moved. The indications of tape position may be a measure of elapsed time following the start of tape transport from a tape reference point, or of the time remaining before a reference point thereon is reached. Thus, a tape may be accurately stopped at a pre-selected frame as, for example, for editing purposes. It is desirable that the timer system provide accurate readout of the tape position at the tape transport location as well as several remote locations, for any of the standard multiple tape speeds and frame rates.

In a typical tape timer system, e.g., U.S. Pat. No. 3,573,360 to Rose et al., assigned to the same assignee as this application, a tape transport drives a tachometer device which supplies timing tach pulses to an electronic counter circuit. One tach pulse per second is generally obtained by employing suitable division ratios for each of the different tape speeds. The tach pulses are counted by the counter circuit, and eventually displayed by associated display apparatus in a time-of-day mode; i.e., in hours, minutes, seconds and/or tenths of seconds. As noted, the division ratios have to be adjusted to compensate for different tape speeds (e.g., four in the video magnetic tape transport art). Both the time-of-day counter circuit and the counters used for performing the division process have to count both up and down; in the first case to provide true real time operation in the event the transport is partially rewound, and in the second case to purge partial counts obtained if the transport is reversed after very brief runs, since the partial counts would add to straight-line operating time. In addition to the division by 8, 4, 2 or 1 to compensate for the four tape speeds (in a video tape recorder/reproducer), tighter time control when reversing count direction is desirable to reduce erroneous counts which might be obtained with tape direction reversals.

Thus, in a sophisticated video tape recorder/reproducer system, it is desirable that the associated time-of-day counter thereof provide; a counter each of whose digits counts moduli six and ten alternately; counting in moduli 8, 4, 2 and 1; generating a buffered count from the tachometer (for example, modulus ten herein); and the capability of changing the modulus of individual digits to display tenths of seconds as the least significant digit.

SUMMARY OF THE INVENTION

The invention provides an improved and simplified time-of-day tape timer system which provides the above-mentioned requirements with a serial binary adder, without need for the usual external dividers for performing the division process. To this end, tape timer tachometer means is mechanically coupled to the tape via a tach wheel, and generates and stores a single negative-going pulse one clock period wide for tach pulses occurring one per second. The tach means is coupled to arithmetic logic means formed of an up/down counter and associated timing and control logic. The up/down counter is formed of a serial binary adder modified to use the least significant digit (LSD) of an eight digit clock as the bi-directional divider by altering the modulus of the LSD to present the correct division rate to the incoming tach pulses. The serial binary adder circulates the digits in serial form, whereby the output inherently is in time-multiplexed form and all eight digits are transmitted using only four wires for the binary code plus one wire to select each displayed digit. The multiplexed output is supplied to a tape timer binary display means formed of five 7-segment light emitting diode (LED) display indicators via a (binary-coded decimal) BCD-to-7-segment decoder. The LED indicators are sequentially clocked via the five digit select lines from the timing and control logic of previous mention.

BRIEF DESCRIPTION OF THE DRAWINGS

FIG. 1 is a block diagram of the tape timer system.

FIGS. 2A, 2B are schematic diagrams exemplifying one implementation of the system of FIG. 1.

FIGS. 3 and 4 are block diagrams exemplifying the count up and count down logic respectively of the system of FIGS. 1 and 2.

DESCRIPTION OF THE PREFERRED EMBODIMENTS

Figure 2A:
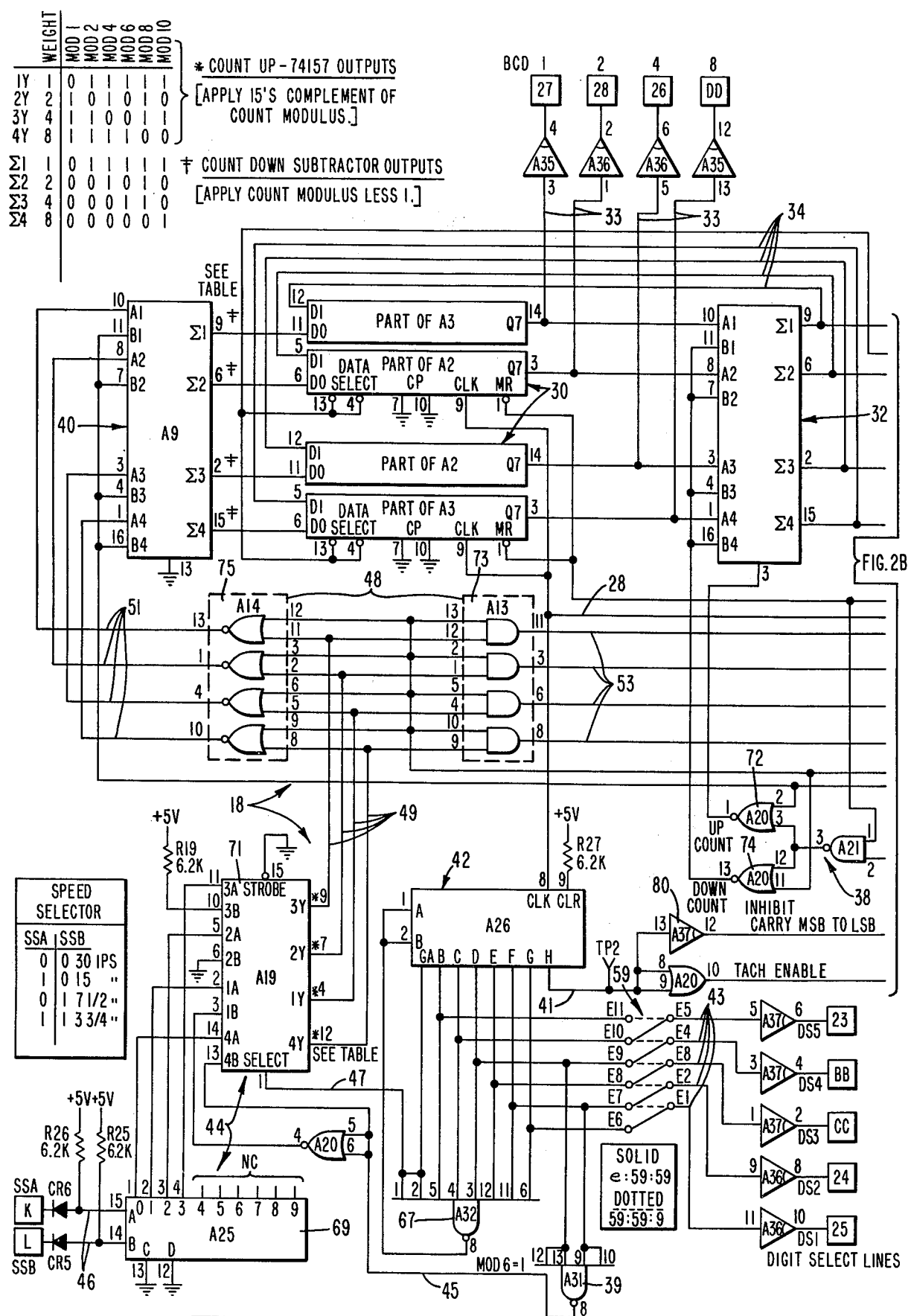

The tape timer system displays in time-of-day mode the elapsed time that the tape has moved at the selected speed from a selected zero reference. Thus, the timer contains a bi-directional counter and associated arithmetic logic to detect the relative tape position and provide a time-multiplexed, binary-coded decimal (BCD) output, for the display of the tape position in hours, minutes, seconds and/or tenths of seconds of play/record time at a selected tape speed. The tape timer receives a tape direction signal from a control unit, a selected speed signal, and tach pulses from a tape-driven tachometer (tach) of the tape transport. The number of tach pulses received are counted, the length of tape represented by the tach pulses is converted to record/play time at the selected speed, and the time represented by the tape motion from the current time being displayed, depending on the direction of tape motion, is added or subtracted. The tape timer sends five BCD digits to a binary display means. To minimize the number of interconnecting leads between the tape timer and the display unit, the five digits are transmitted serially over a common 4-bit bus to a BCD-to-7-segment decoder, whereupon the output of the decoder is introduced in parallel to five 7-segment display indicators that comprise the 5-digit display means. Five digit select lines are also supplied to the display means, to identify each digit fed from the tape timer and to enable the corresponding one of the five 7-segment display indicators.

Referring to FIG. 1, the tape timer of the invention includes tape timer tach means 12 operatively coupled to tape timer arithmetic logic means 14 formed of bi-directional counter means 16 and associated timing/control logic means 18. The BCD digits generated by the bi-directional counter means 16, and the digit select signals from the timing/control logic means 18, are introduced to tape timer display means 20 whereby the display indicators are selectively enabled to generate the time-of-day display.

More particularly, the tach means 12 includes a tape timer wheel assembly 22 with associated electro-optical switching assembly within the tape transport apparatus (not shown) to provide one complete rotation thereof, for example, for each 7.5 inches of tape movement. The electro-optical switch interrupts the optical path at the rate of twenty times per revolution, and supplies TTL-level pulses to a buffer circuit 24 which provides pulse shaping to improve the rise and fall times of the tach pulses. The buffered tach pulses are fed to a tach pulse synchronizer 26 which includes two D-type latches that are clocked by the positive-going edge of a 432 kHz system clock introduced via line 28. The synchronizer 26 retimes the tach pulses to provide a single negative-going pulse one clock period wide for each tach pulse received, regardless of the length of the tach pulse.

As previously mentioned, the tape timer arithmetic logic means 14 includes a bi-directional counter means 16 and associated timing/control logic means 18. The bi-directional (up/down) counter means 16 is formed of an 8-digit serial binary adder which circulates data through a 4-bit parallel adder serially by digit. The up/down counter 16 thus provides the incrementing and decrementing of time in hours, minutes, seconds and/or tenths of seconds, and division of the tach pulse rate according to the selected operating speed. In FIG. 1, the serial binary adder in turn includes a shift register 30 whose output is coupled to an adder 32, and also to the data input of the display means 20 via (four) BCD data lines 33. The output of adder 32 is coupled back to the shift register 30 input via a recirculation loop 34, and is also coupled to a modulo boundary detector 36. The detector 36 includes an adder circuit 35 (FIG. 2B) whose output comprises a carry signal coupled back to the shift register 30 and also to the input of a carry/tach pulse latch means 38, via a carry line 37. Latch means 38 receives an output from, and supplies an input to, the tach pulse synchronizer 26 of the tach means 12, and also supplies a synch tach/carry signal to the adder 32. A ones subtractor 40 is coupled at its output to the input of the shift register 30. The shift register 30 and the carry/tach pulse latch means 38 are clocked via the 432 kHz system clock via line 28 to thereby synchronize the operation of the components within the tape timer serial binary adder (counter 16).

The timing/control logic means 18 of previous mention includes an 8-bit ring counter 42 which is coupled via a $t_7$ tach enable line 41 to the tach pulse synchronizer 26, and whose digit select lines 43 (DS1–DS5) are coupled to the tape timer display means 20. The ring counter 42 identifies the digit currently at the output of the 8-digit, 4-bit, serial binary adder (up/down counter 16) and provides the control for multiplexing the digits from the adder at the display means 20. The ring counter 42 is further coupled to a modulo logic 44 via a modulo 6/10 line 45, and a $t_0$ line 47. After the first digit during which the modulus of the LSD is altered to account for the tape speed, the modulo 6/10 line 45 includes means for identifying when a modulus 6 or 10 is present to thereby alter the modulus in accordance with the time-of-day mode, e.g., 9, 59, 59. The modulo logic 44 includes inputs SSA and SSB from the tape transport speed selector switch (not shown) via lines 46, as well as the timing signals from the ring counter 42. The output of the modulo logic 44 is coupled to a complementary encoder 48 via line 49, which in turn generates the modulus on line 51 to the ones subtractor 40, or its complement on line 53, to the modulo boundary detector 36. A direction latch 50, which is set by a true direction command (TDR) on line 55 from the capstan servo (not shown), generates an UP control signal on line 57 to complementary encoder 48 as well as to the adder 32. The ring counter 42 and the direction latch 50 are synchronized via the 432 kHz system clock on line 28 to thereby synchronize the operation of the components of the timing/control logic means 18 and the up/down counter means 16.

The serial stream of BCD digits generated via the shift register 30 are introduced via the BCD data line 33 to a BCD-to-7-segment decoder 52, which in turn is coupled to five 7-segment light emitting diode (LED) display indicators 54 to provide the display means 20. The digit select lines 43 from the ring counter 42 are coupled to the LED display indicators 54 to selectively enable same. The BCD-to-7-segment decoder 52 provides a logic low (ground) to the individual segments of the indicators 54, as required to generate the digit in the display means 20.

Table I included below shows the format for the eight 4-bit digits contained in the four 8-bit shift registers 30, and the time interval during which each of the four bits representing a single digit are available at the output of the register 30. As shown in the table, the first time period ($t_0$) contains a digit whose modulus varies with the tape speed. Since the tach pulses are generated at a rate of 20 times per 7.5 inches of tape, the modulus of the digit at time $t_0$ depends upon the tape speed selected to divide the tach pulses by a factor which provides ten pulses per second at the selected operating speed. At a selected operating speed of, for example, 30, 15, 7.5 and 3.75 inches per second, the modulus of the digit at time $t_0$ is 8, 4, 2 and 1 respectively. The digits at time $t_1$ through $t_7$ represent the operating time in hours, minutes, seconds and tenths of a second at the selected operating time. Five digits are herein displayed by the LED display indicators 54, by way of example only.

TABLE I

| COUNTER DATA WORD FORMAT | |
|---|---|
| Modulus | Time |
| Tape-Speed Divider (modulo depends on tape speed selected) | $t_0$ |
| Tenths of Seconds (modulus 10) | $t_1$ |
| Units of Seconds (modulus 10) | $t_2$ |
| Tens of Seconds (modulus 6) | $t_3$ |
| Units of Minutes (modulus 10) | $t_4$ |
| Tens of Minutes (modulus 6) | $t_5$ |
| Units of Hours (modulus 10) | $t_6$ |
| Tens of Hours (modulus 10) | $t_7$ |

The digits at time $t_1$–$t_5$ or at time $t_2$–$t_6$, may be selected by changing the mechanical links 59 (FIG. 2A) disposed in the digit select lines 43 (DS1–DS5) of the arithmetic logic means 14 to display tenths of a second, seconds and minutes, or to display seconds, minutes and hours respectively on the display means 20. The former link 59 connection is shown in dotted line, and the latter link connection is shown in solid line in FIG. 2A infra.

Referring still to FIG. 1, in operation, the up/down counter 16, formed of the serial binary adder, shifts each digit in the counter data word in a 4-bit slice to the data output thereof. If a tach pulse is not received by the tape timer arithmetic logic within the previous cycle ($t_0$–$t_7$), the data is recirculated through the up/down counter 16 without being modified. If a tach pulse is received by the tape timer arithmetic logic during the previous cycle ($t_0$–$t_7$), the count in the up/down counter 16 is incremented by one when the tape motion is in a forward direction, or decremented by one when the tape motion is in the reverse direction.

In the timing/control logic means 18, the ring counter 42 is clocked by the positive-going edge of the 432 kHz signal and generates the 8-bit time intervals ($t_0$–$t_7$) for one cycle of operation of the up/down counter 16. Referring also to FIGS. 2A, 2B, the modulo logic 44 receives the speed selector signals SSA and SSB from the tape transport speed selector switch (not shown) via a one-of-ten decoder 69 and timing information from the ring counter 42 via a switching means 71. The modulo logic 44 generates the 15's complement of the modulus for each digit in the counter data word at the corresponding time interval. Thus at time $t_0$, ring counter 42 enables the modulo logic 44 via line 47 to provide the modulo information commensurate with the tape speed supplied via SSA and SSB lines 46. After $t_0$, the select input to the switching means is held high, and if NAND gate 39 output is high on line 45, pin 13 of means 71 is high and a binary nine is added to the 15's modulo boundary detector 36 through the non-inverting AND stage 73. This provides modulus 6 decoding. When NAND gate 39 is low, line 45 and pin 13 are low, i.e., the MSD of the 4-bit word from the one-of-ten decoder 69 is low, and modulus 10 decoding is provided via the switching means 71 and the detector 36. A multiple NAND gate 67 inserts a single zero into the ring counter 42, to provide the circulating zero for use as the timing signal to apply the tach pulse to the shift register 30. When the zero is in the final output position in the ring counter 42, the MSD is present at the output to the shift register 30 due to the one clock delay of a carry flip-flop 68 of latch 38, described infra. The MSD prepares the tach for entry to the shift register 30 and one clock later during the LSD the tach is entered.

As may be seen, the modulo boundary detector 36 is selectively pre-biased to allow a single 15's decoder to detect a plurality of different moduli. During the first digit time $t_0$, the detector is pre-biased with counts of 7, 11, 13 and 14 corresponding to the speed binary coded signals of 8, 4, 2 and 1, and speeds of 30, 15, 7.5 and 3.75 inches per second, respectively. During the remaining digits after $t_0$, the detector 36 is pre-biased with counts of 9 or 5 corresponding to moduli of 6 or 10 for time-of-day display of such digits. The modulo information, in 15's complement, is sent to the complementary encoder 48 which, in turn, provides the modulus or its complement to the ones subtractor 40, or to the modulo boundary detector 36, respectively. To this end, the direction latch 50, which is set by the tape up/down command from the capstan servo (not shown) delivers the control signal UP to complementary encoder 48 and to adder 32. The UP signal, if set (high) gates the complemented modulus from the complementary encoder 48 to modulo boundary detector 36 via line 53. If the UP signal is reset (low), the UP signal gates the modulus from the encoder 48 to the ones subtractor 40 via line 51. The UP signal fed to the adder 32 provides the up or down control signal to increment or decrement the up/down counter means 16 when the tach pulse has been received.

Referring also to the display means 20, the (five) lines that comprise the output of the BCD-to-7-segment decoder 52 are connected in parallel to each of the corresponding segments of the (five) 7-segment display indicators 54a–54e. Each of the 7-segment displays consist of seven LEDs with common anodes. Selection of the 7-segment pattern corresponding to the digit sent via the BCD-a through BCD-d lines is accomplished by applying a positive five volts (logic high) to the anode of the selected 7-segment display, while keeping the anodes of the other 7-segment displays at ground (logic low). The digit selection signals DS1 through DS5 from the timing/control logic means 18 via lines 43, provide a positive five volts to the anode of the 7-segment display indicators 54a–54e, respectively. When a digit select line goes low, the associated transistor switch thereof conducts and provides a positive five volts to the anode of the corresponding 7-segment display. Since only one digit select line goes low at one time, the remaining transistor switches of the displays are not conducting, and the remaining anodes of the unselected 7-segment displays remain at zero volts DC. Therefore, only the selected digit is lit. It is to be understood that other numbers of digits in the data word, display indicators, BCD data lines, digit select lines, etc., may be employed.

Referring to FIGS. 2A–2B there is shown in greater detail a schematic diagram exemplifying one implementation of the combination tape timer of FIG. 1. Like components in the two figures are similarly numbered. As in FIG. 1, the tach means 12 includes the tach wheel assembly 22, the buffer circuit 24 and the tach pulse synchronizer 26, formed of two D-type latches 60, 62. The tape timer system is initialized by pressing a reset button CRB (not shown) which generates a reset signal on a line 56. When CRB is low, the tach/carry pulses generated by the carry flip-flop 68 of the carry/tach pulse latch means 38, are inhibited from going to the up/down counter means 16, and the contents of the shift register 30 are cleared. The tape timer system is also initialized by a wake-up signal on line 58, which is generated when power is first applied to the system via a "wired-OR" that forces the CRB signal on line 56 to the required logic low.

When the output of the buffer 24 goes positive due to the presence of a tach pulse, latch 60 is set by the positive-going edge of the 432 kHz system clock, and the output thereof is fed to latch 62, and to a NAND gate 64. Latch 62 is set to the same state as latch 60 by the next positive-going edge of the 432 kHz clock. The output of latch 60 is combined with the complement of latch 62 by NAND gate 64, so that during the interval that latch 60 is first set and latch 62 is set one clock interval later, the output of NAND gate 64 goes low. During all other conditions, NAND gate 64 remains high. The output of NAND gate 64 is coupled to a tach pulse latch 66 which is an RS-type flip-flop, which stores the received synchronous tach pulse until required by the arithmetic logic means 14, and clocked via a tach enable line 41 and NAND gate 65.

When the tape is moving in a forward direction, the tape timer system is in a count-up mode. During this time, the TDR signal on line 55 (the up/down command) is high, and the direction latch 50 is set by the positive-going edge of the 432 kHz clock on line 28. With direction latch 50 set, the Q output of the carry flip-flop 68 is directed to a carry input of the adder 32 through a NOR gate 72. The 4-bit data from the modulo logic 44 is gated to the modulo boundary detector 36 via non-inverting AND gate stage 73 of the complementary encoder 48 and line 53, and the 4-bit data to the ones subtractor 40 via an inverting NOR gate stage 75 and line 51 is low. Referring in addition to FIG. 3, which shows a simplified block diagram of the serial binary adder formed by the shift register 30 and associated components 32, 36 and 40, each BCD digit is shifted serially through the shift register 30 and adders 32, 35 and 40 as a parallel 4-bit number by the 432 kHz clock. At time $t_0$, the LSD of the 8-digit BCD number is shifted out of the register to the A inputs of the adder 32. During the count-up mode, the B inputs to adder 32 from a NOR gate 74 are low, and the carry-in to adder 32 will go high only when a tach pulse has been received during the previous $t_0$–$t_7$ cycle, or a carry is generated at any period other than $t_7$. If no tach pulse was received during the previous cycle ($t_0$–$t_7$), the LSD which is present at $t_0$ is unchanged by adder 32, and the output thereof is recirculated back to the input of the shift register 30 via lines 34. The output of the adder 32 is also fed to the A inputs of adder 35 of the modulo boundary detector 36. The B inputs of adder 35 are the 15's complement of the modulus for that specific digit. At time $t_0$, the modulus is determined by the setting of the speed selector on the tape transport. The complemented modulus at the B inputs to (adder 35) detector 36 during $t_0$ is 7, 11, 13 and 14 for selected speeds of 30, 15, 7.5 and 3.75 inches per second, respectively.

The output of the adder 35 is fed to a NAND gate 76 of detector 36 which provides a low (zero V DC) signal to a data select input of the shift register 30 and, via a NAND gate 78, to carry flip-flop 68. As long as no tach pulses are received by the tape timer arithmetic logic means 14, the count continues to be recirculated through the shift register 30 unchanged and the output of the NAND gate 76 remains high. When a tach pulse is received at the end of time $t_7$, the carry flip-flop 68 is set via the tach enable line 41 and the NAND gate 65 which generates an input to the adder 32 during time $t_0$. This input increments the LSD from the shift register, whereby the incremented output of the adder 32 is summed with the complemented modulus by the modulo boundary detector 36. If the resulting sum does not equal 15, NAND gate 76 remains high and the incremented digit is clocked back into the shift register 30 at the start of $t_1$ via lines 34, and the carry flip-flop 68 is not set again. Therefore, the remaining digits at $t_1$–$t_7$ are recirculated unchanged through the shift register 30. If, at the start of $t_0$, a tach pulse had been received and the resulting incremented output of adder 32 plus the complemented modulus equaled 15, the output of NAND gate 76 goes low, and the incremented digit is not recirculated back to the shift register 30. Instead, the output of the ones subtractor 40 is selected which, during count-up, is always equal to zero.

In addition to selecting the output of ones subtractor 40 as the input to the shift register 30, the low output of NAND gate 76 also sets carry flip-flop 68 at the start of the next time interval $t_1$ via the NAND gate 78. At this time, the second LSD is shifted out to the adder 32 and, if carry flip-flop 68 is set (the LSD plus complemented modulus equals 15) the carry-in to adder 32 is high and the second LSD is incremented. The sum from adder 32 during time $t_1$ is added to the complemented (base 16) modulus by modulo boundary detector 36 and, if the sum equals 15, NAND gate 76 thereof goes low. Zero is loaded into the shift register 30 and the carry flip-flop 68 is set to provide a carry-in to adder 32 at $t_2$. If the sum out of detector 36 does not equal 15, NAND gate 76 will remain high and the incremented sum out of adder 32 is recirculated back to the shift register 30 via lines 34.

This process is repeated during each successive digit times $t_2$–$t_6$. At $t_7$, the most significant digit (MSD) is shifted out of the shift register 30 to the adder 32. The status of the carry flip-flop 68 is inhibited from generating a carry-in to adder 32 by the $t_7$ timing pulse via a buffer 80, which is "wired-ANDed" with the output of the carry flip-flop 68 via a buffer 82. Since during $t_7$ the MSD is never incremented, a carry is not generated into the LSD as a result of the MSD exceeding the modulus.

When the tape is moving in a reverse direction, the tape timer system is in a count-down mode, and the up/down command on line 55 is low and the direction latch 50 is reset by the positive-going edge of the 432 kHz clock on line 28. The output of carry flip-flop 68 is directed to the B inputs of adder 32 through the NOR gate 74, the 4-bit data from the modulo logic 44 is gated to ones subtractor 40 via complementary encoder 48 and line 51, and the 4-bit B inputs to adder 35 of modulo boundary detector 36 are low. FIG. 4 shows a simplified block diagram of the serial binary adder formed by the shift register 30 and the associated logic components 32, 36 and 40. During the count-down mode, the carry-in to adder 32 from the NOR gate 72 is held low, and the 4-bit B inputs to adder 32 go high when a tach pulse has been received during the previous $t_0$–$t_7$ cycle, or a carry is generated at any other period than $t_7$. If no tach pulse is received during the previous cycle ($t_0$–$t_7$) the LSD which is present at $t_0$ is unchanged by the adder 32. The output of the adder is recirculated back to the input of the shift register 30 via lines 34, and is also sent to the A inputs of the modulo boundary detector 36. The B inputs to the adder 35 of detector 36 are always zero during the count-down mode. Ones subtractor 40 is used to input the data into shift register 30 when a borrow is detected. The A inputs to ones subtractor 40 is the modulus for that specific digit, ergo, during time $t_0$, the modulus at the A input to ones subtractor 40 is 8, 4, 2 or 1 for selected tape speeds of 30, 15, 7.5 and 3.75 inches per second, respectively. All four B inputs are always high during count-down thereby adding 15 (or the 16's complement of one). Therefore, during count-down, the sum output of the ones subtractor 40 is always equal to the modulus minus one. This insures that the correct number is present to succeed zero in the count-down sequence.

When a tach pulse has been received during the previous cycle ($t_0$–$t_7$), carry flip-flop 68 is set at start of $t_0$ via the tach enable line 41 and the NAND gate 65, and the set output therefrom is gated to the B inputs of adder 32 via NOR gate 74. Therefore, when the carry flip-flop is set, all B inputs are high. When the carry flip-flop 68 is reset, all B inputs are low. At time $t_0$, the LSD is shifted out of the shift register 30 to adder 32. If a tach pulse was not received, the sum output of the adder 32 is recirculated to the input of the shift register 30 unchanged. If a tach pulse was received in the previous cycle, carry flip-flop 68 is set at $t_0$ and the LSD that is being shifted out at this time is summed with the B inputs to adder 32, which is all ones. By adding all ones (or the 16's complement of one) to the output of the shift register 30, one is subtracted from the count. The sum from adder 32 is sent to the modulo boundary detector 36 where it is transferred to the inputs of the NAND gate 76 unchanged, since during count-down only zero (all B inputs low) is added to the sum from the adder 32 by detector 36. If decrementing the LSD generates a 15 (zero minus one equals 15 in hexadecimal), NAND gate 76 goes low and sets carry flip-flop 68 at the end of time $t_0$.

At the same time that NAND gate 76 goes low, the output of ones subtractor 40 is substituted for that of the adder 32 at the input of the shift register 30. This output is always equal to one less than the modulus of the digit currently being processed. At $t_1$, the second LSD is transferred out of the shift register 30 to the adder 32. If at $t_0$, the carry flip-flop 68 is set, the second LSD will be decremented. The output of the adder 32 is checked by modulo boundary detector 36 in the same manner as during $t_0$ for a count of 15. If the count of 15 is not detected, the output of the adder 32 is recirculated back to the shift register 30 via the lines 34. If 15 (15 equals zero count) is detected as the result of decrementing the digit from the shift register 30, the output of ones subtractor 40 is shifted into the shift register 30 as the correct number to follow zero in the countdown sequence.

In a similar manner, the remaining digits $t_2$–$t_7$ are processed in the count-down mode with the exception that during $t_7$ the output of the carry flip-flop 68 is disabled.

If the tape runs out, tach pulses may still be generated by the tachometer wheel due to inertia. In order to prevent the tach pulses from being counted, an abort signal, generated by the tape transport on a line 84 when the tape runs out, inhibits the output from the carry flip-flop 68. The abort signal is received by an open-collector buffer 86, whose output is "wire-ORed" with the buffer 82, which buffers the output of the carry flip-flop 68. When the abort signal goes low, the buffered output of the carry flip-flop 68 is held low by buffer 86 and further counting of tach pulses is inhibited.

What is claimed is:

1. A timer for generating a time-of-day record of the position of a medium bi-directionally moved by an associated medium transport apparatus, for different medium speeds, the apparatus including a medium-driven tachometer for generating tach pulses, and speed selector control means for generating a binary coded speed signal indicative of the different speeds, comprising the combination of;

up/down counter means including serial binary adder means for serially circulating a series of digits and for detecting said tach pulses to selectively increment or decrement the least significant digit of the series;

timing/control logic means coupled to said binary coded speed signal and to the up/down counter means for selectively altering the modulus of the least significant digit commensurate with the binary coded speed signal at any instant of medium movement;

wherein the seconds digit of the series of digits increments or decrements precisely once per second in response to the altering of the least significant digit modulus commensurate with the binary coded speed signal.

2. The timer of claim 1 wherein the up/down counter includes a single modulus detector capable of being altered to detect the different moduli of the least significant digit formed in response to the binary coded speed signal corresponding to the different medium speeds.

3. The timer of claim 2 wherein the timing/control logic means includes modulo logic means for generating binary patterns representative of the binary coded speed signal produced at the different medium speeds, said binary patterns being combined with the least significant digit in accordance with the medium direction to directly alter the modulus thereof.

4. The timer of claim 3 wherein the timing/control logic means includes ring counter means operatively coupled to the modulo logic means for generating multiple bit time intervals for cycling the up/down counter means.

5. The timer of claim 4 wherein the up/down counter means further includes a ones subtractor and a carry flip-flop integral with the serial binary adder thereof, said single modulus detector being integral within the serial binary adder, wherein the carry flip-flop receives the tach pulses and the ones subtractor and single modulus detector receive the coded speed information from the timing/control logic means when the medium movement is in the reverse and forward directions respectively, said serial binary adder reversing the counting direction upon reversal of the medium direction.

6. The timer of claim 5 wherein the serial binary adder means includes a shift register, the ones subtractor coupled to the input of the shift register, an adder coupled to the shift register output and input, the carry flip-flop coupled to the adder, and said single modulus boundary detector is coupled from the adder to the carry flip-flop and to the shift register.

7. The timer of claim 6 wherein the timing/control logic means includes means for detecting the direction of medium movement, and complementary encoder means formed of a non-inverting and an inverting stage, wherein the non-inverting stage introduces the complement of the modulus to the single modulus detector when the medium is in the forward direction, and the inverting stage introduces the modulus to the ones subtractor when the medium is moving in the reverse direction.

8. The timer of claim 3 wherein the single modulus detector is further alterable to detect moduli during digits other than the least significant digit, which correspond to the time-of-day mode of the respective displayed digits.

9. The timer of claim 8 wherein the modulo logic means generates other binary patterns representative of binary coded digit signals commensurate with respective displayed digits of the time-of-day record, said other binary patterns being combined with said digits other than the least significant digit.

10. The timer of claim 9 wherein the timing/control logic means includes means for selectively generating a binary 9 or a binary 5 for introduction to the single modulus detector, wherein the latter further detects a modulus 6 or a modulus 10, respectively, which correspond to the time-of-day mode of the respective displayed digits of the series.

11. The timer of claim 10 wherein the means for generating binary 9 and 5 further includes gate means coupled to the ring counter means, wherein the modulo logic means is coupled to the ring counter means and gate means for generating the binary 9 and 5.

12. The timer of claim 11 wherein the single modulus detector is a 15's detector, the shift register is a 4-by-8-bit shift register, the binary patterns indicative of medium speeds for pre-biasing the single 15's detector are binary 7, 11, 13 and 14 for speeds of 30, 15, 7.5 and 3.75 inches per second respectively, and the digit display means includes a BCD-to-7 segment decoder and a 7-segment display indicators means.

13. A timer for displaying the time-of-day position of a medium bi-directionally movable via transport apparatus, the latter including a medium-driven tachometer for generating tach pulses at a selected rate, speed selector control means for generating a binary coded speed signal indicative of different medium speeds, and binary time-of-day digit display means, the combination comprising:

up/down counter means including serial binary adder means for generating and circulating a multiple-digit binary-coded decimal data word which is incremented and decremented in response to the tach pulses and to the direction of medium movement; and timing/control logic means coupled to the up/down counter means and to the speed selector control means for generating a digit select signal, for generating binary patterns indicative of the different medium speeds which when selectively combined with the data word alters the counter means modulus commensurate with the speed of the medium, and for further generating binary patterns indicative of the respective digits to be displayed which when selectively combined with the data word alters the counter means modulus accordingly;

wherein a selected portion of the binary-coded decimal data word is displayed by said binary time-of-day digit display means in response to the digit select signal.

14. The timer of claim 13 wherein the binary patterns indicative of the different medium speeds are selectively combined to alter the counter means modulus as an integral part thereof at any instant of medium movement to generate a plurality of desired moduli.

15. The timer of claim 14 wherein the serial binary adder includes a single modulus detector integral therewith and capable of being prebiased with a selectable number of counts, wherein the detector detects a desired modulus corresponding to the counts remaining before generation thereby of a carry output, such that the single detector may selectively detect the plurality of moduli desired.

16. The timer of claim 15 wherein the single modulus detector includes;

modulus detector adder means capable of being prebiased with the selected number of counts commensurate with the desired modulus; and gate decoder means coupled to the modulus detector adder means to detect binary 15 and thus the modulus corresponding to the counts remaining before the generation of the carry output.

17. The timer of claim 16 wherein the timing/control logic means further includes means for detecting the direction of medium movement, and for introducing the complement of the respective modulus to the up/down counter means when the medium is moving in the forward direction, and for introducing the respective modulus to the counter means when the medium is moving in the reverse direction.

18. The timer of claim 17 wherein the serial binary adder changes from an incrementing to a decrementing function, and vice versa, immediately at such time that the means for detecting the direction detects a direction change.

19. The timer of claim 18 wherein the binary patterns indicative of the different medium speeds alter the modulus of the least significant digit of said data word as an integral part thereof, and further alter the modulus of respective digits of the data word other than the least significant digit which other digits are to be displayed by the digit display means in response to the digit select signal.

20. The timer of claim 13 wherein the serial binary adder means circulates the digits in serial form to inherently generate the multiple digits of the data word in time-multiplexed format for introduction to the digit display means.

21. The timer of claim 20 further including means integral with said digit select lines for changing the digit display means from a time-of-day display of hours, minutes and seconds to minutes, seconds and tenths of seconds, and vice versa.

22. A timer for generating a time-of-day record of the position of a medium being moved by associated medium transport apparatus, for different medium speeds, the apparatus including speed selector control means for generating a binary coded speed signal indicative of the speed, and binary time-of-day digit display means, the timer comprising the combination of;

arithmetic logic means including timing/control logic means, and up/down counter means responsive to the logic means for selectively altering during a given time period the modulus of the counter means commensurate with the binary coded speed signals at any instant of medium movement at any of the different speeds, and for further selectively altering during different time periods the modulus of the counter means commensurate with the respective display digit being displayed by the time-of-day display means, wherein the seconds digit thereof increments and decrements precisely once per second.

23. In a timer for generating a time-of-day binary digit display of the position of a medium being moved, for different medium speeds, the improvement comprising, up/down counter means for generating and circulating a multiple-digit binary-coded decimal data word including serial binary adder means and having a single modulus detector for detecting the respective modulus corresponding to each digit of the circulating data word; and, binary pattern generating means coupled to the single modulus detector for generating binary patterns indicative of the different medium speeds and the respective digits of the time-of-day binary digit display, and for altering the modulus of the least significant digit of the circulating data word and of the time-of-day digits by prebiasing the single modulus detector with the binary pattern; wherein the single modulus detector decodes the modulus of each digit of the data word in response to the generated binary pattern to generate thereby a carry output.

* * * * *